United States Patent
Takao et al.

(10) Patent No.: US 12,494,347 B2
(45) Date of Patent: Dec. 9, 2025

(54) PLASMA PROCESSING APPARATUS

(71) Applicant: HITACHI HIGH-TECH CORPORATION, Tokyo (JP)

(72) Inventors: Yusuke Takao, Tokyo (JP); Ryoichi Isomura, Tokyo (JP); Kohei Sato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/908,781

(22) PCT Filed: Jun. 21, 2021

(86) PCT No.: PCT/JP2021/023318
§ 371 (c)(1),
(2) Date: Sep. 1, 2022

(87) PCT Pub. No.: WO2022/269659
PCT Pub. Date: Dec. 29, 2022

(65) Prior Publication Data
US 2024/0194453 A1    Jun. 13, 2024

(51) Int. Cl.
*H01J 37/32* (2006.01)
*H01L 21/67* (2006.01)

(52) U.S. Cl.
CPC .. *H01J 37/32449* (2013.01); *H01J 37/32522* (2013.01); *H01J 2237/334* (2013.01); *H01L 21/67069* (2013.01)

(58) Field of Classification Search
CPC ........... H01J 37/32449; H01J 37/32522; H01J 2237/334; H01L 21/67069
See application file for complete search history.

(56) References Cited

U.S. PATENT DOCUMENTS 6,319,327 B1 * 11/2001 Tsukada .............. C23C 16/4481
118/724
6,815,362 B1   11/2004 Wong et al.
(Continued)

FOREIGN PATENT DOCUMENTS

JP   H05-042990 A   2/1993
JP   H09-048690 A   2/1997
(Continued)

OTHER PUBLICATIONS

Search Report mailed Aug. 17, 2021 in International Application No. PCT/JP2021/023318.
(Continued)

*Primary Examiner* — Yuechuan Yu
(74) *Attorney, Agent, or Firm* — Miles & Stockbridge, P.C.

(57) ABSTRACT

Provided is a plasma processing apparatus having high safety whose running cost is reduced. The plasma processing apparatus includes: a vacuum container; a processing chamber disposed inside the vacuum container; and a processing gas line through which a processing gas is supplied into the processing chamber to form plasma in the processing chamber, in which the processing unit includes a plurality of pipes through which a plurality of types of gases flow respectively every type of gas, and a box body surrounding the pipes, and air whose temperature is adjusted to a predetermined range is supplied to the box body.

17 Claims, 7 Drawing Sheets

(56) References Cited

U.S. PATENT DOCUMENTS

| | | | |
|---|---|---|---|
| 7,204,913 B1 | 4/2007 | Singh et al. | |
| 8,557,709 B2 | 10/2013 | Sumiya et al. | |
| 8,767,166 B2 | 7/2014 | Kubota et al. | |
| 2003/0005943 A1 | 1/2003 | Singh et al. | |
| 2004/0014327 A1 | 1/2004 | Ji et al. | |
| 2004/0099635 A1* | 5/2004 | Nishikawa | H01L 21/67017 216/58 |
| 2004/0235303 A1 | 11/2004 | Wong et al. | |
| 2011/0036291 A1* | 2/2011 | Jauhiainen | C30B 25/14 118/715 |
| 2011/0114130 A1 | 5/2011 | Kang et al. | |
| 2011/0265813 A1 | 11/2011 | Okai et al. | |
| 2013/0087174 A1 | 4/2013 | Sun et al. | |
| 2014/0166049 A1 | 6/2014 | Kang et al. | |
| 2015/0020969 A1* | 1/2015 | Sriraman | H01J 37/32963 156/345.24 |
| 2017/0194561 A1 | 7/2017 | Suyama et al. | |
| 2018/0082855 A1 | 3/2018 | Sasaki et al. | |

FOREIGN PATENT DOCUMENTS

| | | | |
|---|---|---|---|
| JP | H09-283371 A | | 10/1997 |
| JP | 10251855 A | * | 9/1998 |
| JP | H11-168092 A | | 6/1999 |
| JP | 2000-150387 A | | 5/2000 |
| JP | 2001-044186 A | | 2/2001 |
| JP | 2008-053456 A | | 3/2008 |
| JP | 2008-060171 A | | 3/2008 |
| JP | 2011-100820 A | | 5/2011 |
| JP | 2011-192872 A | | 9/2011 |
| JP | 2016-066801 A | | 4/2016 |
| JP | 2018-046216 A | | 3/2018 |
| KR | 10-2001-0039751 A | | 5/2001 |
| KR | 10-2011-0054287 A | | 5/2011 |
| TW | 200402458 A | | 2/2004 |
| TW | 201207520 A | | 2/2012 |
| WO | 2011158691 A1 | | 12/2011 |

OTHER PUBLICATIONS

Written Opinion mailed Aug. 17, 2021 in International Application No. PCT/JP2021/023318.

Written Opinion mailed Aug. 3, 2021 in International Application No. PCT/JP2021/020226.

Search Report mailed Aug. 3, 2021 in International Application No. PCT/JP2021/020226.

Office Action mailed Feb. 9, 2018 in Korean Application No. 10-2017-0004059.

Office Action mailed Oct. 3, 2017 in Taiwanese Application No. 106102963.

Office Action mailed Jul. 11, 2023 in Japanese Application No. 2022-546089.

Office Action mailed Oct. 24, 2024 in Korean Application No. 10-2022-7029789.

* cited by examiner

[FIG. 1A]
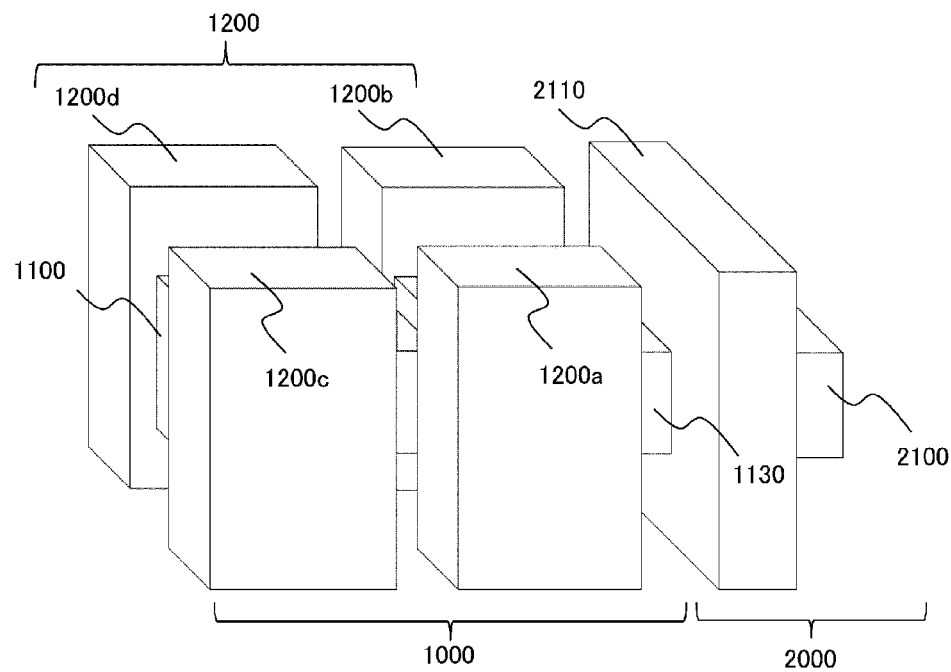
[FIG. 1B]
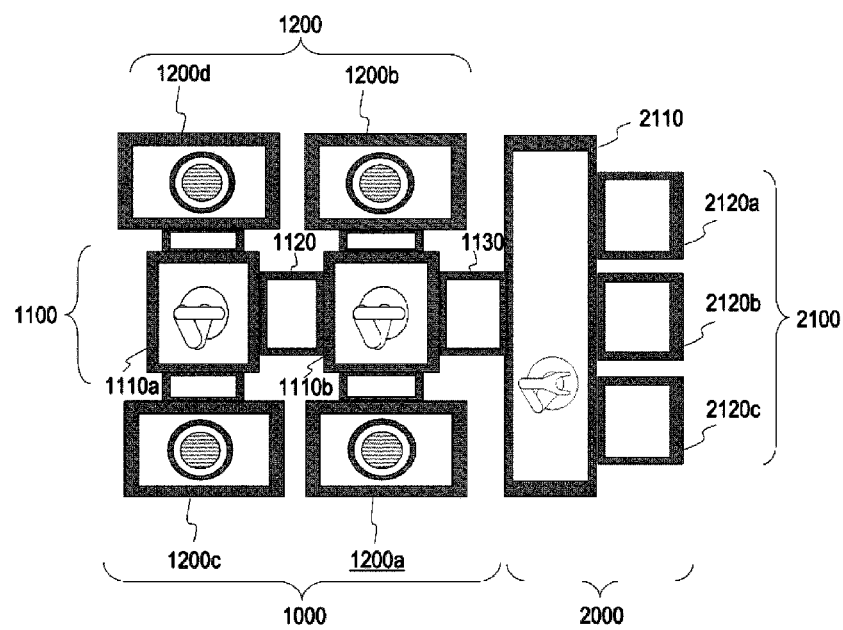

[FIG. 2]
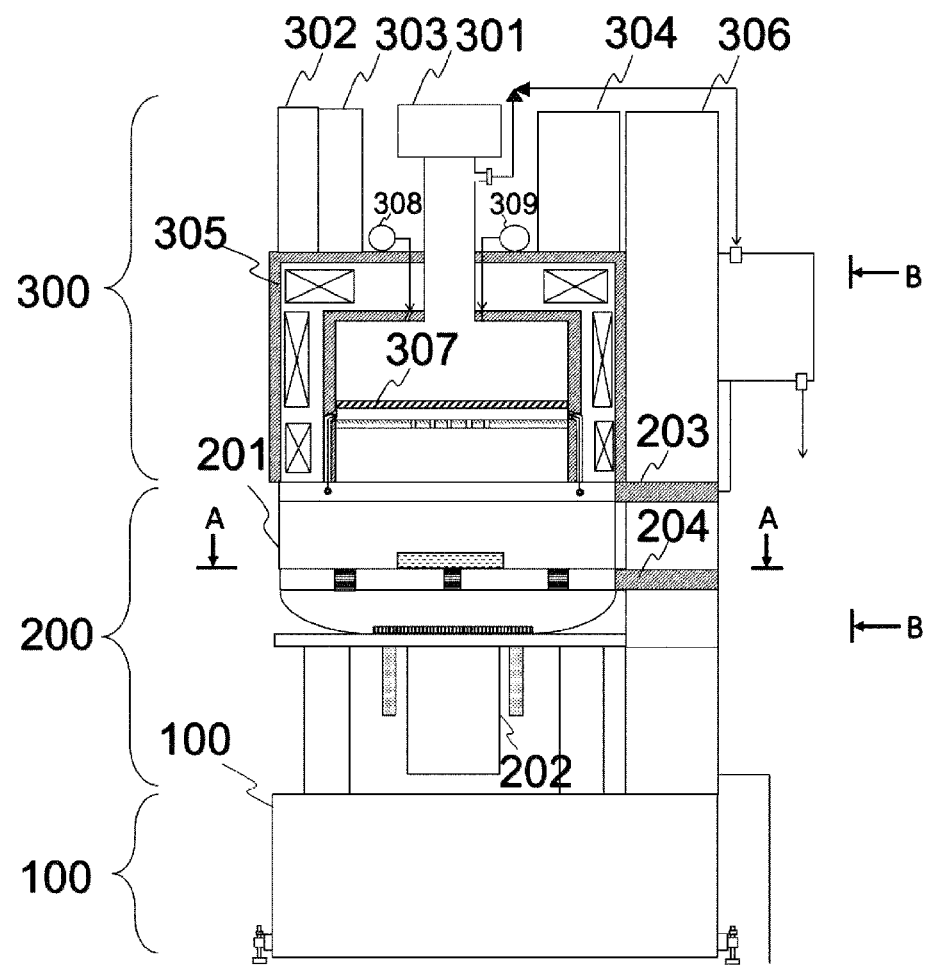

[FIG. 3]
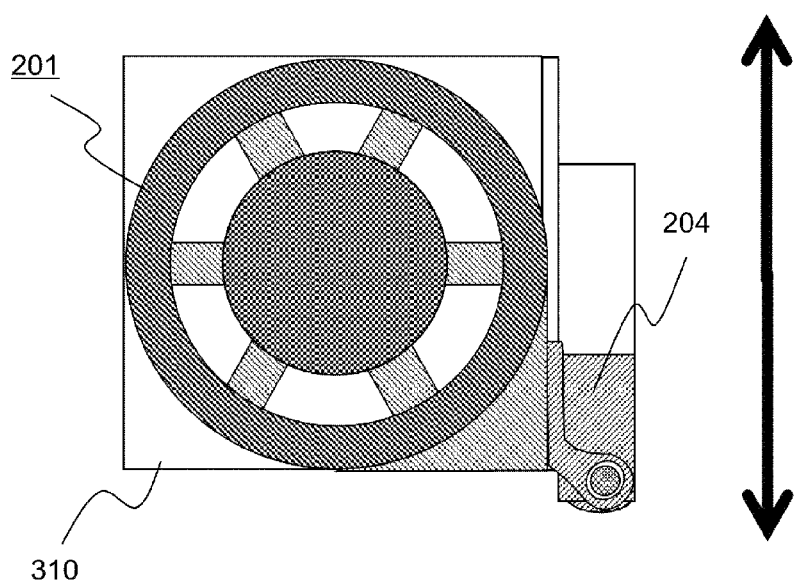

[FIG. 4]
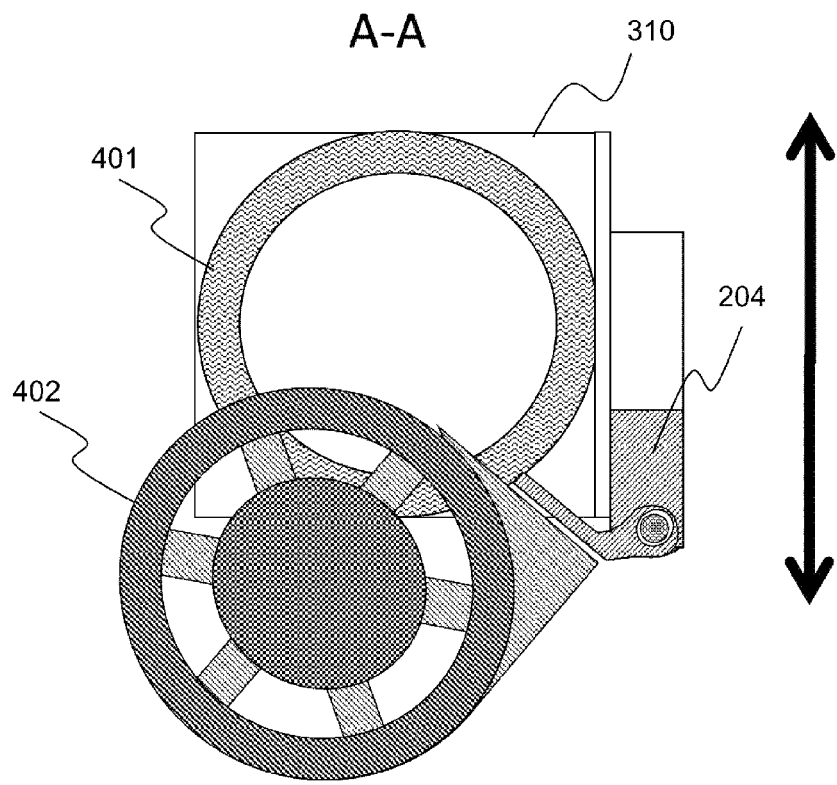

[FIG. 5]
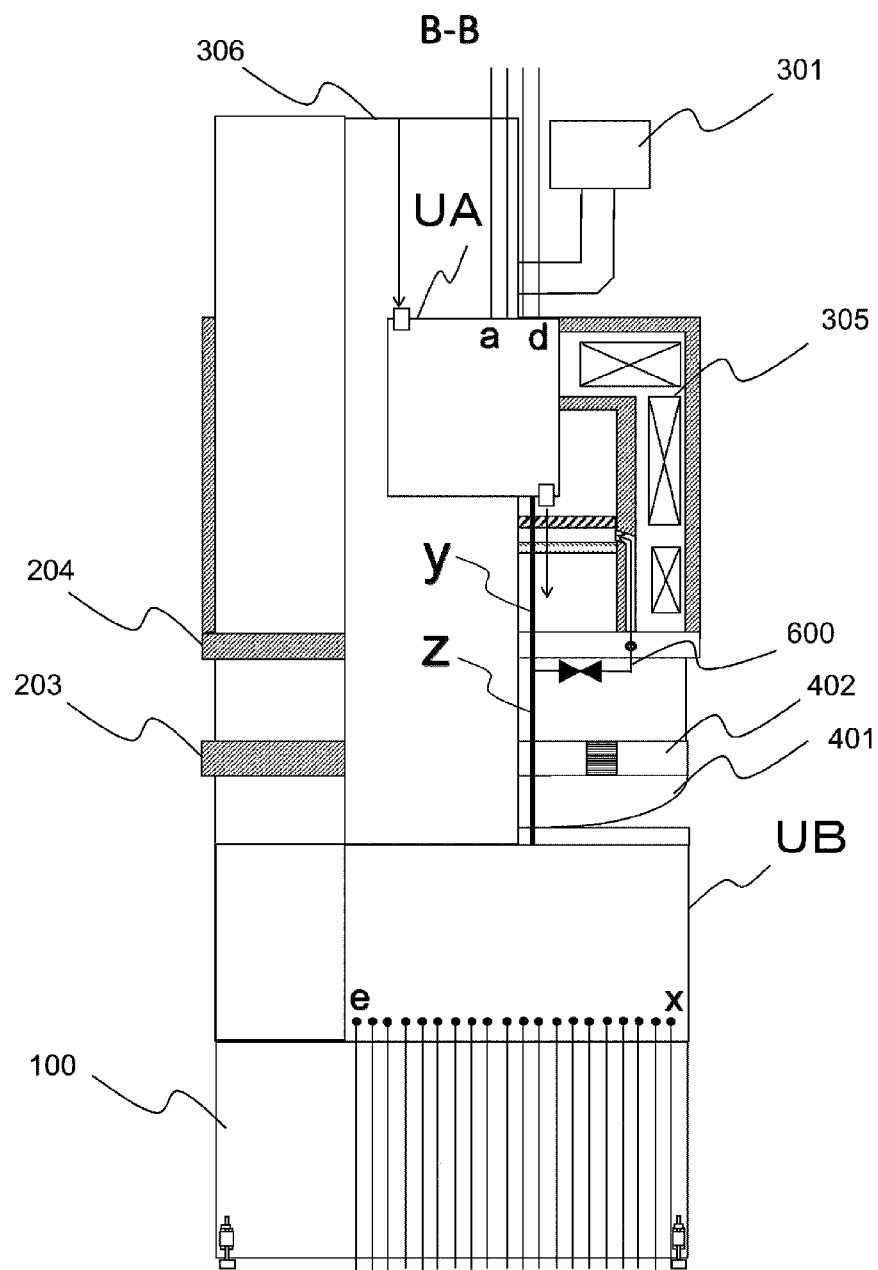

[FIG. 6]
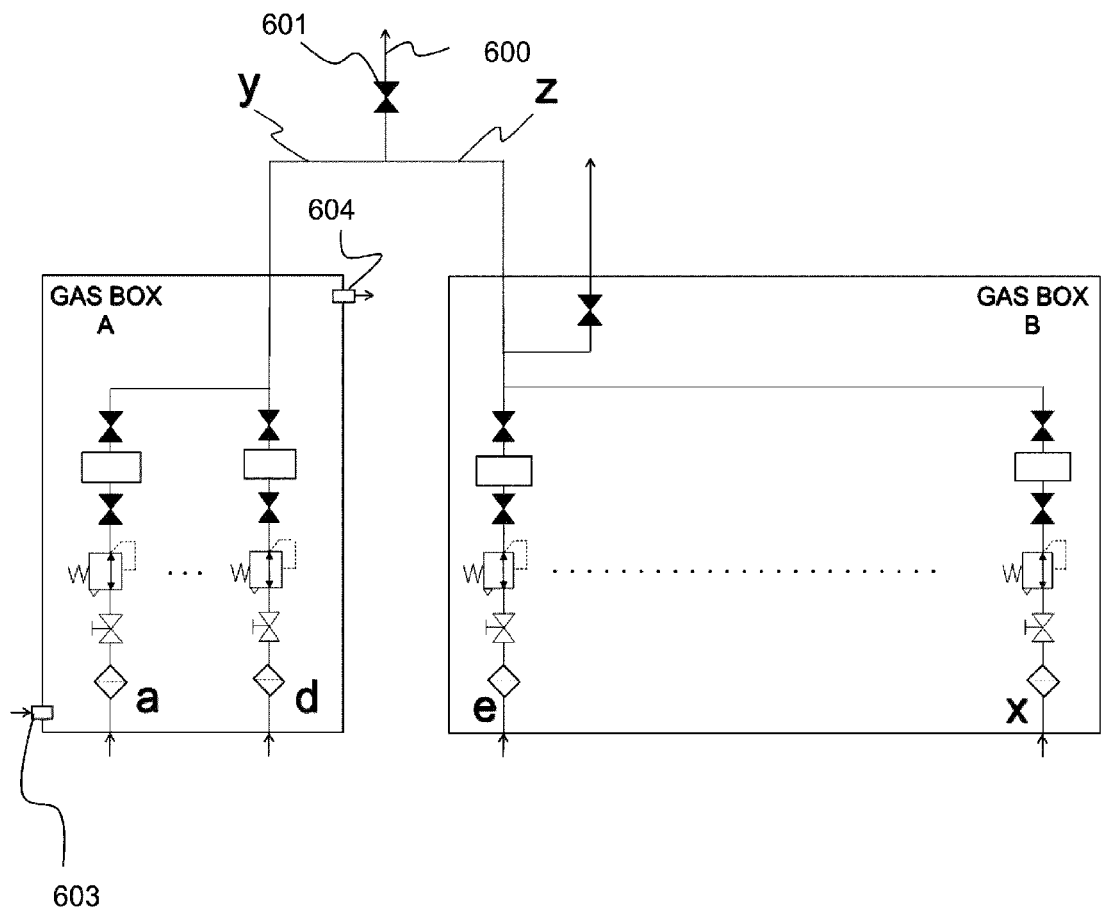

[FIG. 7]
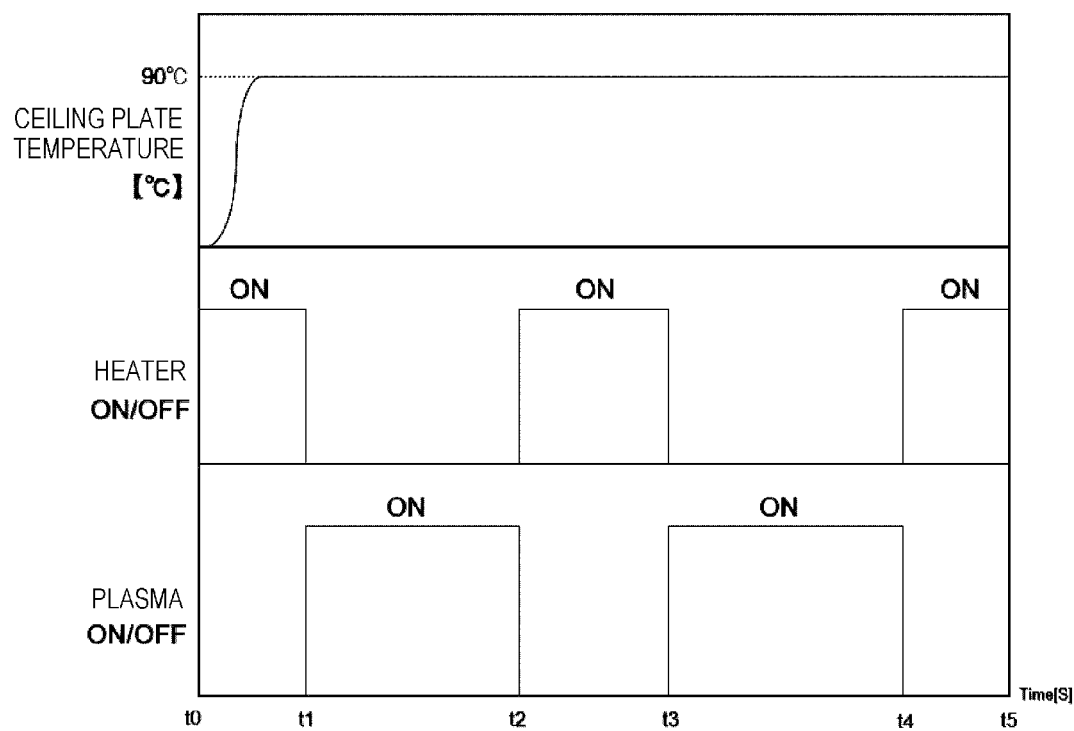

PLASMA PROCESSING APPARATUS

TECHNICAL FIELD

The present invention relates to a plasma processing apparatus.

BACKGROUND ART

In a plasma processing apparatus that supplies a plurality of types of gases to a processing chamber in a vacuum container and processes a substrate-shaped sample to be processed such as a semiconductor wafer, which is disposed in the processing chamber, a mixed gas containing the plurality of types of gases is supplied as a processing gas. The related art using such a plasma processing apparatus is disclosed in, for example, PTLs 1 and 2.

According to the technique disclosed in PTL 1, a deposition film is deposited in a processing chamber by forming plasma using a mixed gas of a $SiCl_4$ gas and an $O_2$ gas or a mixed gas of a $SiCl_4$ gas and a methane gas in the processing chamber. Thereafter, an inside of the processing chamber is plasma-cleaned by using a first gas containing a fluorine element, so that the inside of the processing chamber is plasma-cleaned. Further, a material to be processed is placed on a sample table disposed in the processing chamber. The material to be processed is plasma-etched after the material to be processed is placed on the sample table. The inside of the processing chamber is plasma-cleaned using a second gas containing a fluorine element after the material to be processed is plasma-etched.

According to the technique disclosed in PTL 2, when a sample in which a film containing a metal element is disposed is plasma-etched in a processing chamber, an inside of the processing chamber is plasma-cleaned using a gas containing a boron element, and the boron element is removed using plasma after the plasma cleaning. Further, the inside of the processing chamber is plasma-cleaned using a gas containing a fluorine element after the boron element is removed. After the plasma cleaning using the gas containing the fluorine element, a deposition film is deposited in the processing chamber by plasma formed using a gas containing a silicon element. The sample is plasma-etched after the deposition film is deposited.

CITATION LIST

Patent Literature

PTL 1: JP-A-2016-066801
PTL 2: JP-A-2018-046216

SUMMARY OF INVENTION

Technical Problem

The related art has the following problems.

That is, in the related art, when the plasma that etches the material to be processed is formed using the mixed gas, a gas temperature is required to be controlled within an appropriate range in order to keep each gas in a gas state. In particular, since a low vapor pressure gas such as $SiCl_4$ is condensed at a temperature close to a room temperature, ingenuity is required for preventing liquefaction and maintaining the gas state when the gas is supplied from a building in which a vacuum processing apparatus is provided. In order to prevent such liquefaction of the low vapor pressure gas, a measure is generally considered in which a heater is wound around a pipe for supplying a $SiCl_4$ gas and performs heating to maintain a temperature of the gas within a range in which the gas state can be maintained.

However, according to studies made by the inventors, it has been found that the above measure mainly has the following problems.

(1) Since pipes for supplying a gas are generally disposed in a manner of being considerably close to each other, it takes time to wind the heaters in a narrow space, and a time until the plasma processing apparatus is provided or an operation thereof is started becomes longer.

(2) Further, in general, gas pipes for supplying such a plurality of types of gases are collected at one place and pass through one container (gas box). However, when taking the measure to wind the heater around the respective pipes, a volume of the gas box increases, which causes interference with other components and hardly ensures a mounting space, or the number of gas pipes that can be accommodated in the gas box is inevitably reduced, which may deteriorate a function of the plasma processing apparatus. Although gas purging is normally performed in the gas box in order to release a gas leaking from a pipe joint or the like to the outside, gas purging efficiency may be reduced due to an increase in the volume of the container of the gas box.

(3) When the heaters are wound around the gas pipes in a non-uniform manner, a portion (cold spot) whose temperature is locally lowered is generated, and if the gases remain in the portion, the liquefaction may occur.

(4) Further, since power to be supplied to the heaters is additionally required, power during the operation of the plasma processing apparatus is increased.

(5) In the case in which a combustible gas is used, an ignition source is required to be eliminated from the gas box from the viewpoint of ensuring safety when a supply pipe for the combustible gas is disposed in the gas box. Since the heaters may be ignition sources, it is difficult to use the heaters in the gas box through which the supply pipe for the combustible gas passes. Further, in order to reduce a gas concentration in the gas box to a level at which there is no risk of ignition in the case of leakage of the combustible gas, a purge gas is also supplied into the gas box. Therefore, even if the gas pipes can be heated by heating devices that do not serve as the ignition sources, an increase in a flow rate of the purge gas is required with the increase in the volume of the gas box, and an operation cost of the plasma processing apparatus increases.

The invention has been made in view of the above problems, and an object thereof is to provide a plasma processing apparatus having high safety whose running cost is reduced.

Solution to Problem

In order to solve the problems, as one of typical plasma processing apparatuses according to the invention, there is provided a plasma processing apparatus including:
a vacuum container;
a processing chamber disposed inside the vacuum container; and
a gas supply unit including a pipe through which a low vapor pressure gas is supplied into the processing chamber to form plasma in the processing chamber, in which the low vapor pressure gas passing through the pipe is maintained in a gas state by supplying air having a temperature higher than room temperature around the pipe.

As one of the typical plasma processing apparatuses according to the invention, there is provided a plasma processing apparatus including:

a vacuum container;

a processing chamber disposed inside the vacuum container; and a gas supply unit including a processing gas line through which a processing gas is supplied into the processing chamber to form plasma in the processing chamber, in which the gas supply unit includes a first plurality of pipes through each of which one of a plurality of different types of gases including a low vapor gas flows, at least one flow rate controller configured to adjust a flow rate of gas flowing through an inside of one of the first plurality of pipes, a joining portion in which the each of the first plurality of pipes are connected at a position located downstream of the at least one flow rate controller, and a first box body surrounding the first plurality of pipes and the at least one flow rate controller and the joining portion, and the first box body includes an introduction port through which air whose temperature is adjusted to a predetermined range to cause the low vapor gas flowing in the one of the first plurality of pipes to be maintained in a gas state is supplied into an inside room of the first box body, and a discharge port through which the air in the first box body is discharged.

Advantageous Effects of Invention

The invention provides a plasma processing apparatus having high safety whose running cost is reduced.

BRIEF DESCRIPTION OF DRAWINGS

FIG. 1A is a diagram schematically illustrating an outline of a configuration of a vacuum processing apparatus including a plasma processing apparatus according to an embodiment of the invention.

FIG. 1B is a top view of the vacuum processing apparatus shown in FIG. 1A.

FIG. 2 is a side view schematically illustrating a configuration of a vacuum processing unit of the vacuum processing apparatus according to the embodiment shown in FIG. 1.

FIG. 3 is a plan view schematically illustrating a cross section of the vacuum processing unit shown in FIG. 2 taken along a plane A-A.

FIG. 4 is a plan view schematically illustrating a cross section of the vacuum processing unit shown in FIG. 2 taken along the plane A-A.

FIG. 5 is a side view schematically illustrating a configuration of the vacuum processing unit shown in FIG. 2 as viewed from a side facing a plane B-B.

FIG. 6 is a diagram schematically illustrating a schematic configuration of gas supply units according to the embodiment shown in FIG. 5.

FIG. 7 is a time chart illustrating a flow of an operation of ceiling plate temperature adjustment with a lapse of time, which is performed by a plasma processing unit of the vacuum processing apparatus according to the embodiment shown in FIG. 1.

DESCRIPTION OF EMBODIMENTS

Hereinafter, an embodiment of the invention will be described with reference to the accompanying drawings.

First Embodiment

Hereinafter, a first embodiment of the invention will be described with reference to FIGS. 1 to 7.

First, a configuration of a plasma processing apparatus according to the present embodiment will be described with reference to FIGS. 1A and 1B. FIG. 1A is a diagram schematically illustrating an outline of a configuration of a vacuum processing apparatus including the plasma processing apparatus according to the present embodiment, and is a perspective view illustrating an outline of the entire configuration of the vacuum processing apparatus. FIG. 1B is a top view of the vacuum processing apparatus shown in FIG. 1A. In FIGS. 1A and 1B, a right side is regarded as a front side, and a left side is regarded as a rear side.

In the figure, the vacuum processing apparatus according to the present embodiment is roughly divided into a vacuum-side block 1000 and an atmosphere-side block 2000 along a front-rear direction (left-right direction in the figure). These components are connected to each other via a passage whose communication is airtightly opened and closed by a gate valve (not shown).

The vacuum-side block 1000 includes a vacuum transfer block 1100 and a vacuum processing unit 1200 which are connected with each other. Each of the vacuum transfer block 1100 and the vacuum processing unit 1200 includes a vacuum container, and a substrate-shaped sample which is a processing target such as a semiconductor wafer is transferred to a space inside the vacuum container which is depressurized.

The atmosphere-side block 2000 includes an atmospheric transfer container 2110 in which the sample is transferred inside a container whose internal pressure is maintained at a value equal to or close to an atmospheric pressure (slightly higher in the present example), and a cassette mounting table 2100 which is disposed on a front surface of the atmospheric transfer container 2110 and which has an upper surface on which a cassette capable of accommodating a plurality of samples to be processed therein is mounted. In the present example, for the cassette mounting table 2100, three cassette mounting tables 2120a to 2120c are arranged in a horizontal direction along the front surface of the atmospheric transfer container 2110.

The vacuum transfer block 1100 according to the present example includes vacuum transfer containers 1110a and 1110b which have a substantially rectangular shape in a plan view, an intermediate chamber container 1120 which is connected to the vacuum transfer containers 1110a and 1110b and whose inside communicates with insides of the vacuum transfer containers 1110a and 1110b, and a lock chamber container 1130 that connects the vacuum transfer container 1110b and the atmospheric transfer container 2110. Each of vacuum processing units 1200a to 1200d (collectively referred to as vacuum processing unit 1200) is connected to a respective one of side wall surfaces of the vacuum transfer containers 1110a and 1110b according to the present example.

Each of the four vacuum processing units 1200a to 1200d according to the present example includes the vacuum container including therein a processing chamber that is depressurized to a predetermined degree of vacuum, and a vacuum pump that is disposed below the vacuum container and discharges a gas in the processing chamber therein to depressurize the processing chamber, and a side wall of each of the vacuum containers and a respective one of the side wall surfaces of the vacuum transfer containers 1110a and 1110b are detachably connected to each other. Further, a gate, which is a passage penetrating side walls of a vacuum container and a vacuum transfer container and allowing insides of the two containers to communicate with each other, is disposed, and the gate is airtightly closed or opened by gate valves (not shown). The sample to be processed is loaded and unloaded through the opened gate between a processing chamber in a vacuum container of each of the vacuum processing units 1200 and a transfer chamber in each of the vacuum transfer containers.

A surface treatment for the sample is performed by airtightly sealing and partitioning a processing chamber, which is a space inside a vacuum container, with a valve or the like, discharging the gas in the processing chamber by driving the vacuum pump (see a vacuum pump 202 in FIG. 2), and depressurizing the inside to a predetermined pressure.

Then, while a gas for processing the sample is supplied to the depressurized space from a gas supply pipe line connected to a gas storage tank which is a gas source (not shown), an electric field or a magnetic field is supplied from a supply unit that supplies the electric field or the magnetic field to excite the gas, and plasma is formed in a space above a mounting surface of a sample table.

A detailed configuration of a vacuum processing container of the vacuum processing unit 1200 will be described later.

In the vacuum processing apparatus according to the present embodiment, a surface, on which the cassette mounting tables 2120a to 2120c on a front side of a casing constituting the atmospheric transfer container 2110 are disposed, is disposed with a space from an adjacent vacuum processing apparatus along a line where a cassette on a floor of a building such as a clean room is transferred. A space around the vacuum processing apparatus, such as a space between the vacuum processing units 1200 adjacent to each other in the front-rear direction and a space on a rear side (left side in FIG. 1B) of the vacuum processing apparatus, is an operation space through which an operator passes or in which an operation can be performed, and a distance larger than a width of at least one person in the left-right direction is left.

In the vacuum processing apparatus according to the present embodiment, the plurality of (two in the present example) vacuum transfer containers 1110a and 1110b are connected to each other in the front-rear direction (the left-right direction in FIG. 1B) with the intermediate chamber container 1120 interposed therebetween, and the side wall surfaces of the vacuum transfer containers 1110a and 1110b face each other. Each of the vacuum transfer containers 1110a and 1110b has a rectangular shape in a plan view or a shape substantially the same as a rectangular shape, and the vacuum processing units 1200 are connected to the side wall surfaces on respective sides in the left-right direction (upper-lower direction in FIG. 1B) as viewed from the front of the vacuum processing apparatus. Further, the two vacuum processing units 1200 are disposed adjacent to each other with a space between at least respective vacuum containers in the front-rear direction (left-right direction in FIG. 1B). Therefore, the space is a space in which a new component can be mounted without interfering with other devices, and is the only space that is not a wet cleaning operation area or a maintenance area of the vacuum processing apparatus.

Next, a configuration of the vacuum processing unit 1200 will be described. FIG. 2 is a side view schematically illustrating a configuration of the vacuum processing unit 1200 in the vacuum processing apparatus according to the embodiment shown in FIG. 1. The present embodiment shows configurations of the vacuum processing units 1200a, 1200b, 1200c, and 1200d shown in FIG. 1B, and since the vacuum processing units 1200a, 1200b, 1200c, and 1200d have the configurations in which components have the same shape and structure and are arranged relative to each other, the vacuum processing unit 1200a will be described here as an example.

The vacuum processing unit 1200a is roughly divided into the following three parts. One part is a processing unit 200 that includes a vacuum container 201 (vacuum chamber) having a processing chamber therein, and the vacuum pump 202 including a turbo molecular pump that is disposed below the vacuum container 201 and discharges a gas in the processing chamber.

Further, another part is a plasma forming unit 300 that is disposed above the vacuum container 201 and forms and propagates the electric field or the magnetic field to be supplied into the processing chamber. The remaining part is a bed portion 100 that is disposed below the processing unit 200 and serves as a table supporting the processing unit 200 and the plasma forming unit 300 above the processing unit 200 from below.

The vacuum container 201 of the processing unit 200 includes the processing chamber therein, and is partitioned by airtightly sealing the inside of the vacuum container 201 with respect to an outside atmosphere. Although not illustrated, the vacuum container 201 includes, for example, a loading port, that is, an opening through which the sample is loaded into the processing chamber in an upper portion, and has a structure in which an internal space on an opening side can be partitioned by a partition valve. In other words, the processing chamber includes the opening through which a substrate is loaded, and has the structure in which the internal space on the opening side is kept airtight by the partition valve.

The processing chamber in the vacuum container 201 includes a sample table that is cylindrical and disposed close to the processing chamber that is cylindrical such that central axes thereof coincide with or are regarded as coinciding with each other, and a substrate electrode that is disposed inside the sample table and to which radio frequency bias power is supplied. The sample (wafer) is transferred onto a mounting surface of the sample table in the processing chamber of the vacuum container 201, and in a state in which the sample is held on the mounting surface, a target film of a film structure formed and disposed in advance on a surface of the sample is etched by plasma formed using a processing gas introduced into the chamber. The vacuum pump 202 is disposed below the vacuum container 201, and is connected to the vacuum container 201 to discharge the gas in the vacuum container.

The plasma forming unit 300 is disposed above the processing container of the processing unit 200. Further, the plasma forming unit 300 includes a radio frequency oscillation unit 301, a wafer bias power supply 302, a wafer bias matching unit 303, an ESC power supply 304, a coil portion 305, and the like. The radio frequency oscillation unit 301 constitutes a plasma generating unit, and includes, for example, a magnetron or the like that forms an electric field for generating the plasma in the processing chamber.

The wafer bias power supply 302 supplies bias power to the substrate electrode. The substrate electrode is disposed in the vacuum container 201 and is a metal disk disposed inside the sample table having the mounting surface that is an upper surface, on which the sample is placed and adsorbed and held during processing. The wafer bias matching unit 303 adjusts the bias power supplied to the substrate electrode.

The ESC power supply 304 supplies DC power to an electrode disposed inside a dielectric film constituting a mounting surface of the substrate electrode in order to electrostatically attract a processing object on the substrate electrode. The substrate electrode covers the upper surface of the sample table in order to cause the sample to be electrostatically adsorbed on the mounting surface that is the upper surface of the sample table.

Further, these components are disposed above the vacuum container 201 of the processing unit 200 so as to surround an upper side and a lateral outer periphery of the processing chamber, and are disposed above an upper surface of the cylindrical coil portion 305 to which the DC power is supplied. The coil portion 305 is disposed above the vacuum container, and constitutes a plasma generating unit including a unit of generating the electric field and the magnetic field. In the present embodiment, there is provided a lifter 306 including a shaft body disposed parallel to a central axis of the vacuum container 201 in an upper-lower direction. The lifter 306 is connected to a portion on an outer peripheral side of the vacuum container 201 above the bed portion 100 and is fastened and positioned by a bolt, a screw, or the like. The coil portion 305 is connected to the shaft body of the lifter 306 as one unit as a whole, and the coil portion 305 can be moved in the upper-lower direction by moving a connecting portion with the coil portion 305 in the upper-lower direction along the shaft body.

The bed portion 100 is disposed below the vacuum container 201 and the vacuum pump 202 of the processing unit 200, and includes a coil power supply, a power distribution unit, a processing chamber frame, a level adjustment adjuster, and the like.

In the present embodiment, as shown in FIGS. 3 and 4, in a maintenance operation of the vacuum processing unit 1200a, a cylindrical member constituting the vacuum container 201 can be pivotally moved by using pivoting units 203 and 204.

FIGS. 3 and 4 are plan views schematically illustrating cross sections of the vacuum processing unit shown in FIG. 2 taken along a plane A-A. An upward arrow in the figure indicates a direction in which the vacuum transfer container 1110a connected to the vacuum processing unit 1200a is disposed, and a downward arrow in the figure indicates a direction in which an operation space is disposed. The operation space is a space disposed in the left-right direction as viewed from the front of the vacuum processing apparatus, and an operator can pass through the operation space or perform an operation therein.

In the vacuum processing apparatus according to the present embodiment, during the maintenance operation of the vacuum processing unit 1200a, as shown in FIG. 4, the cylindrical member constituting the vacuum container 201 is pivoted and moved to the operation space by using the pivoting unit 203 or 204 pivotably connected to the shaft body of the lifter 306, and then maintenance and inspection operations such as replacement and cleaning of a component are performed.

The lifter 306 constitutes a part of the vacuum container 201, and is disposed at a lower end of the container and mounted on an upper surface of an outer peripheral region of a base plate 310 whose lower surface is connected to the vacuum pump 202. The shaft body of the lifter 306 in the upper-lower direction is positioned with respect to the base plate 310 and the vacuum container 201 by fastening of screws, bolts, or the like. The shaft body of the lifter 306 is connected to a discharge portion of a cylindrical discharge chamber portion and the discharge base plate connected to an outer peripheral side of the discharge portion of the cylindrical discharge chamber portion such that the discharge portion of the cylindrical discharge chamber portion and the discharge base plate can pivot around the shaft, with the coil portion 305 and the radio frequency oscillation unit 301 that are disposed above the discharge base plate, the wafer bias power supply 302, the wafer bias matching unit 303, and the ESC power supply 304 which are disposed above and coupled to the discharge base plate. With this configuration, together with the discharge portion base plate connected to the lifter 306, these components form a mechanism to move up and down.

In the maintenance operation of the vacuum processing unit 1200a, when an inside of the vacuum container 201 is opened to an atmosphere (opened to atmospheric air) after a pressure of the inside of the vacuum container 201 is set to be equal to an atmospheric pressure, first, the discharge base plate, the discharge chamber portion and the coil portion 305 disposed above the discharge base plate, and the like are lifted by a predetermined distance, and thereafter, the discharge chamber portion, the coil portion 305, and the like are pivotally moved around the vertical axis of the lifter 306 together with the pivoting unit 203 to open an upper portion of the vacuum container 201. Further, a sample table ring base 402 on which an upper container is placed is rotated and moved around the vertical axis of the lifter 306 together with the pivoting unit 203, and a ring-shaped upper end portion of a lower container 401 having a cylindrical shape is exposed. After that, the lower container 401 is detached from the base plate 310, and the maintenance and inspection operations are performed on the upper container, the lower container 401, and the base plate 310.

FIG. 5 is a side view schematically illustrating a configuration of the vacuum processing unit shown in FIG. 2 as viewed from a side facing a plane B-B.

In FIG. 5, a gas supply device that adjusts supply of a gas for processing a sample supplied into the processing chamber inside the vacuum container 201 of the vacuum processing unit 1200a includes a gas supply unit UA disposed on a side surface of the lifter 306, and a gas supply unit UB disposed below the gas supply unit UA and above the bed portion 100. The gas supply units UA and UB that supply mixed gases respectively include gas boxes A and B (FIG. 6) in which pipes through which a plurality of types of gases respectively flow are arranged in parallel in internal spaces, flow rate controllers for the gases and valves that open and close flow of the gases by opening and closing the pipes are arranged in parallel on the pipes, and the pipes and the valves are surrounded by box bodies (containers).

In the figure, in the gas box A of the gas supply unit UA, four gas pipes extending in parallel from above the box body (referred to as a first box body) penetrate through a box body upper wall and extend to an inside of the box body, and one gas pipe penetrates through a box body lower wall and extends downward. In the gas box B of the gas supply unit UB, twenty gas pipes extending in parallel upward from below the bed portion 100 penetrate through a box body lower wall and extend to an inside of the box body, and one gas pipe penetrates through a box body upper wall and extends upward. The gas pipe penetrating through the box body lower wall of the upper gas box A and the gas pipe penetrating through the box body upper wall of the lower gas box B are connected to each other so as to connected to the vacuum container 201 as one mixed gas supply pipe 600 for the processing gas.

FIG. 6 is a diagram schematically illustrating a schematic configuration of the gas supply units according to the embodiment shown in FIG. 5. In order to facilitate understanding of a configuration of the gas box A, the gas box A is shown upside down with respect to the arrangement shown in FIG. 5.

In the gas box A, four gas supply lines (pipes) a to d are arranged in parallel inside the box body having a rectangular shape in a side view, and each pipe is provided with the flow rate controller that increases or decreases a flow rate of a gas to adjust the flow rate, at least one valve that opens and closes the pipe, and a detector that detects the flow rate or a pressure of the gas. In the gas supply lines a to d, the plurality of types of gases including a gas (hereinafter, referred to as a low vapor pressure gas) flow respectively. The low vapor pressure gas such as $BCl_3$ has flammability and is obtained by vaporizing a substance as a raw material to be a liquid phase at an adjusted temperature in a building such as a clean room in which the vacuum processing apparatus is provided. It is sufficient that the low vapor pressure gas passes through at least one of the gas supply lines a to d. Examples of the low vapor pressure gas include, but are not limited to, $SiCl_4$ and $BCl_3$.

In FIG. 6, lower end sides of the gas supply lines a to d in the box body of the gas box A penetrate the box body lower wall (box body upper wall in FIG. 5) and extend to an outside. On the other hand, an upper end of each of the gas supply lines a to d is connected to one gas supply pipe (first pipe) y in the internal space of the box body, and penetrates through the box body upper wall (box body lower wall in FIG. 5) and extends to the outside.

In the gas box B, gas supply lines (pipes) e to x for a plurality of types of gases which do not allow the low vapor pressure gas to flow therethrough are arranged in parallel inside the box body (referred to as a second box body) having a rectangular shape in a side view, and each pipe is provided with a flow rate controller that increases or decreases a flow rate of the gas to adjust the flow rate, at least one valve that opens or closes the pipe, and a detector that detects the flow rate or a pressure of the gas.

In FIG. 6, lower end sides of the gas supply lines e to x penetrate the box body lower wall, further extend downward from a floor surface of the building in which the vacuum processing apparatus is provided, and are connected to the gas source, whereby each type of gas supplied from under the floor of the building is supplied to the gas box B. On the other hand, upper end sides of the gas supply lines e to x are connected to one gas supply pipe (second pipe) z in the box body, and the gas supply pipe z penetrates through the box body upper wall and extends to the outside.

The gas supply pipe y and the gas supply pipe z are joined and then connected to one mixed gas supply pipe (third pipe) 600. Further, the mixed gas supply pipe 600 is connected to the inside of the processing chamber. Therefore, a mixed gas generated by the joining at a connection portion between the gas supply pipe y and the gas supply pipe z is supplied as the processing gas into the processing chamber in the vacuum container 201 through the mixed gas supply pipe 600. The mixed gas supply pipe 600 is provided with a valve 601 that opens and closes the flow of the gas in the pipe.

In the present example, a length of the gas supply pipe y from the box body of the gas box A to a connection portion with the mixed gas supply pipe 600 is set to be equal to a length of the gas supply pipe z from the box body of the gas box B to a connection portion with the mixed gas supply pipe 600. In the present embodiment, positions of the gas boxes A and B, arrangements of the gas supply lines a to x, and structures of the gas lines such as the connection portion between the gas supply pipes y and z and the mixed gas supply pipe 600 are appropriately selected in order to make lengths of pipes including the mixed gas supply pipe 600 from the gas boxes A and B to the vacuum container 201 shortest.

As described above, the gas box A is used for supplying the plurality of types of gases including the low vapor pressure gas. On the other hand, the gas box B is used for supplying normal gases other than the low vapor pressure gas. In the plurality of gas supply pipes in the gas boxes A and B, a pipe for supplying a purge gas, for example, an argon gas (Ar gas) or a nitrogen gas ($N_2$ gas), is disposed at a position (uppermost stream) farthest from a gas outlet. In the gas box A, the low vapor pressure gas is supplied to the gas supply line other than the gas supply line for the purge gas, and in the gas box B, other types of gases flow. A filter, a manual valve, a regulator, a first air operation valve, a mass flow controller (flow rate controller), and a second air operation valve are disposed on each gas supply line from an upstream side in a gas flow direction.

The gas boxes A and B are respectively disposed above and below in the vicinity of the connection position with the mixed gas supply pipe 600. The pipe from the gas supply line in each of the gas boxes A and B to the connection position with the mixed gas supply pipe 600 is preferably as short as possible and as small as possible in diameter in accordance with a continuity equation and Bernoulli's theorem in order to improve responsiveness. In order to uniformly supply the processing gas, distances from the respective gas supply lines to the connection portion are set such that arrival time points of the gases are equal.

The box body of the gas box A is connected to a gas discharging pipe used for temperature adjustment of a dielectric circular ceiling plate 307 (FIG. 2) which shields the upper portion of the vacuum container 201 as described later, and an inside of the gas box A is heated to a temperature of 40° C. to 50° C., which is higher than a temperature (room temperature) in the building and can prevent liquefaction of the low vapor pressure gas, by using heat of the discharged gas.

As described above, division into the gas supply units UA and UB has the following advantages.

(1) Since the gas box A accommodates only the pipe for the low vapor pressure gas and the pipe for the purge gas, and the box body is miniaturized, a heat capacity of the internal space is smaller than that of a gas box in the related art, and the gas box A can be efficiently heated.

(2) The division into the gas boxes A and B reduces capacities of the box bodies, thereby improving gas purge efficiency.

(3) By reducing sizes of the gas boxes A and B, the gas supply units UA and UB can be easily mounted in the vicinity of a supply unit of the processing gas, and the responsiveness is improved.

The ceiling plate 307 in the present embodiment constitutes an upper lid of the vacuum container 201 of the vacuum processing unit 1200a, and has a function of allowing, for example, a radio frequency electric field in a microwave band formed and transmitted by the radio frequency oscillation unit 301 such as a magnetron to pass through and introducing the radio frequency electric field into the vacuum container 201 from above. Therefore, a temperature of the ceiling plate 307 is required to be adjusted to a value within a predetermined range (90° C. in the present example). In order to adjust the temperature, a cylindrical hollow container connected to a lower end of a waveguide and having a diameter equal to or slightly larger than that of the ceiling plate 307 is disposed above the ceiling plate 307, and air heated by heaters 308 and 309 disposed on an outer peripheral side of the waveguide in which the radio frequency electric field is propagated is introduced into the hollow container through an introduction port. The heated air is discharged from the hollow container through a discharge port. Accordingly, the temperature of the ceiling plate 307 is adjusted.

FIG. 7 is a time chart illustrating a flow of an operation of ceiling plate temperature adjustment performed by a plasma processing unit of the vacuum processing apparatus shown in FIG. 1 with a lapse of time. In this figure, values of a vertical axis represent the temperature [° C.] of the ceiling plate 307, a heater ON/OFF timing, and a plasma ON/OFF timing in FIG. 2 from the top to the bottom. Control of the heaters in conjunction with de-energization of the plasma can be performed by a control device (not shown).

When operation of the vacuum processing unit 1200a is started from a time point to, electric power is supplied (turned ON) to the heaters 308 and 309 shown in FIG. 2 to generate heat, and an atmosphere (air in the present example) around the vacuum processing unit 1200a is heated to supply the heated air into the hollow container from the introduction port disposed in the vicinity of a connection portion with an upper surface of the hollow container. The heated air is in contact with the ceiling plate 307 in the hollow container during a period from the time point t0 to a time point t1, and sufficient heat exchange is achieved by swirling the air on the ceiling plate 307, thereby adjusting the temperature of the ceiling plate 307 to a temperature (for example, 90° C.) within a desired range.

When the plasma is formed in the processing chamber in the vacuum container 201 at the time point t1, the ceiling plate 307 is also heated by heat input from the formed plasma during the processing of the sample. Therefore, if the power is continuously supplied to the heaters 308 and 309, the temperature of the ceiling plate 307 may increase beyond the desired range.

Therefore, the power supply to the heaters 308 and 309 is stopped, and the air in the building around the vacuum processing unit 1200a, which is generally maintained at the room temperature of about 25° C., is supplied from the introduction port into the hollow container through the heaters 308 and 309 whose heat generation is interrupted. Accordingly, since the air having a temperature lower than the temperature of the ceiling plate 307 heated by the plasma swirls on a back surface (upper surface) of the ceiling plate 307 to perform heat exchange, the temperature of the ceiling plate 307 is not excessively increased and is maintained at a value within the desired range during the time point t1 to a time point t2.

On the other hand, when the plasma in the processing chamber is extinguished at the time point t2, the heating of the ceiling plate 307 by the plasma is interrupted, and thus the power is supplied to the heaters 308 and 309 again in order to prevent the temperature of the ceiling plate 307 from decreasing. Accordingly, the air heated by the heaters 308 and 309 is supplied from the introduction port into the hollow container, and the ceiling plate 307 is heated, whereby the temperature of the ceiling plate 307 is adjusted to a value equal to that during the processing until a time point t3. Thereafter, after the time point t3, similarly, the temperature of the ceiling plate 307 is adjusted in the same manner while alternately repeating the generation (t3 to t4) of plasma and the power supply (t4 to t5) to the heaters 308 and 309.

As described above, the air heated by the heaters 308 and 309 and supplied into the hollow container for the temperature adjustment of the ceiling plate 307 is sufficiently heat-exchanged and then discharged from the discharge port formed in the waveguide. Since the air at a time point of discharging air is heated to a predetermined temperature higher than the room temperature by the heaters 308 and 309 or the plasma, thermal energy in the air is wasted if the air is discharged into the building. Therefore, in the present embodiment, the thermal energy of the discharged air is effectively used.

In the present embodiment, the discharged air is introduced into the box body of the gas box A through an air introduction port 603 of the gas box A shown in FIG. 6, heats the inside of the box body, and then flows out from an air discharge port 604. In the gas box A, the pipes of the gas supply lines in the box body are heated by using the heat of the air used for the temperature adjustment of the ceiling plate 307, and a temperature of the low vapor pressure gas flowing through the pipe reaches 40° C. to 50° C., whereby the liquefaction of the low vapor pressure gas can be prevented.

In order to effectively utilize such heat of the discharged air, the gas box A is disposed at a position (for example, within 2 m) close to the discharge port of the air in the hollow container. Since the gas box A is disposed at such a position, the discharged air is prevented from being excessively cooled while moving from the discharge port of the waveguide to the air introduction port 603 of the gas box A. The air introduction port 603 and the air discharge port 604 are disposed on side walls on both sides sandwiching the gas supply lines a to d arranged in parallel in an arrangement direction, are separately disposed on an upper end portion of one side wall and a lower end portion of the other side wall, and are disposed such that height positions thereof in the upper-lower direction are set different and the air flows through the inside of the box body from one diagonal position to the other diagonal position, so that the inside of the box body of the gas box A is filled with the air and the air can sufficiently exchange the heat with the gases flowing through the gas supply lines. In this case, the pipe for the low vapor pressure gas is preferably disposed closer to an air introduction port 603 side than the pipe for the purge gas.

According to the above embodiment, the following advantages are obtained by heating the gas supply pipes in the gas box A using the heat of the air used for the temperature adjustment of the ceiling plate 307.

(1) A temperature of the entire inside of the gas box A can be uniformly increased, an occurrence of a local cold spot can be prevented, and an adverse effect due to the liquefaction of the low vapor pressure gas can be prevented.

(2) Since electric power is not used for adjusting the temperature of the gas box A only, energy saving is excellent, and an increase in an operation cost can be prevented.

According to the present embodiment, liquefaction of a gas can be reduced by arranging gas supply pipes to divide gases into a low vapor pressure gas which may be liquefied and other types of gases, and increasing a temperature in a box body in which the gas supply pipes including a flow rate controller for the low vapor pressure gas are provided, thereby contributing to improvement of safety and reliability of a plasma processing apparatus.

REFERENCE SIGNS LIST 1000 vacuum-side block
1100 vacuum transfer block
1110 vacuum transfer container
1120 intermediate chamber container
1130 lock chamber container
1200 vacuum processing unit
2000 atmosphere-side block
2100 cassette mounting table
2110 atmospheric transfer container
2120a to 2120c cassette mounting table
100 bed portion
200 processing unit
201 vacuum container
202 vacuum pump
203 pivoting unit
204 pivoting unit
300 plasma forming unit
301 radio frequency oscillation unit
302 wafer bias power supply
303 wafer bias matching unit
304 ESC power supply
305 coil portion
306 lifter
307 ceiling plate
308 heater
309 heater
310 base plate
401 lower container
402 sample table ring base
600 mixed gas supply pipe
UA gas supply unit
UB gas supply unit
a to x gas supply line

The invention claimed is:

1. A plasma processing apparatus comprising: a vacuum container; a processing chamber disposed inside the vacuum container; and a gas supply unit including a processing gas line through which a processing gas is supplied into the processing chamber to form plasma in the processing chamber, wherein the gas supply unit includes a first plurality of pipes through each of which one of a plurality of different types of gases including a low vapor pressure gas flows, at least one flow rate controller configured to adjust a flow rate of gas flowing through an inside of one of the first plurality of pipes, a joining portion in which the each of the first plurality of pipes are connected at a position located downstream of the at least one flow rate controller, and a first box body surrounding the first plurality of pipes and the at least one flow rate controller and the joining portion, and wherein the first box body includes an introduction port through which air whose temperature is adjusted to a predetermined range to cause the low vapor pressure gas flowing in the one of the first plurality of pipes to be maintained in a gas state is supplied to into an inside room of the first box body, and a discharge port through which the air in the first box body is discharged.

2. The plasma processing apparatus according to claim 1, wherein
the first box body includes, in a first wall of a pair walls of the first box body, the first plurality of pipes arranged in parallel, the introduction port through which the temperature-adjusted air is introduced, and in a second wall of the pair of walls, a discharge port through which the air in the first box body is discharged.

3. The plasma processing apparatus according to claim 2, wherein
the introduction port and the discharge port are disposed at diagonal positions of the first box body.

4. The plasma processing apparatus according to claim 1, further comprising:
a second box body accommodating a second plurality of pipes through which a gas other than the low vapor pressure gas flows, wherein
the first box body accommodates the first plurality of pipes including the one pipe through which the low vapor pressure gas flows, and
the temperature-adjusted air is supplied to the first box body.

5. The plasma processing apparatus according to claim 4, wherein
the first plurality of pipes entering the first box body are joined and connected to a first pipe,
the second plurality of pipes entering the second box body are joined and connected to a second pipe, and
the first pipe and the second pipe are further joined and connected to the processing chamber via a third pipe.

6. The plasma processing apparatus according to claim 5, wherein
a length of the first pipe from the first box body to a joining portion between the first pipe and the second pipe is equal to a length of the second pipe from the second box body to the joining portion between the second pipe and the first pipe.

7. The plasma processing apparatus according to claim 1, further comprising:
a ceiling plate constituting an upper lid of the vacuum container;
a hollow container formed in a manner of being in contact with the ceiling plate; and
a heater configured to heat air supplied into the hollow container from an outside, wherein
the air passing through the hollow container is supplied to the first box body.

8. The plasma processing apparatus according to claim 7, wherein
the ceiling plate is heated by the plasma formed in the processing chamber, and the heating by the heater is performed when generation of the plasma is interrupted.

9. The plasma processing apparatus according to claim 7, wherein the low vapor pressure gas has flammability.

10. The plasma processing apparatus according to claim 9, wherein
the first box body includes, in a first wall of a pair walls of the first box body, the first plurality of pipes arranged in parallel, the introduction port through which the temperature-adjusted air is introduced, and in a second wall of the pair of walls, a discharge port through which the air in the first box body is discharged.

11. The plasma processing apparatus according to claim 10, wherein
the introduction port and the discharge port are disposed at diagonal positions of the first box body.

12. The plasma processing apparatus according to claim 9, further comprising:
a second box body accommodating a second plurality of pipes through which a gas other than the low vapor pressure gas flows, wherein the first box body accommodates the first plurality of pipes including the one pipe through which the low vapor pressure gas flows, and the temperature-adjusted air is supplied to the first box body.

13. The plasma processing apparatus according to claim 12, wherein the first plurality of pipes entering the first box body are joined and connected to a first pipe, the second plurality of pipes entering the second box body are joined and connected to a second pipe, and the first pipe and the second pipe are further joined and connected to the processing chamber via a third pipe.

14. The plasma processing apparatus according to claim 13, wherein a length of the first pipe from the first box body to a joining portion between the first pipe and the second pipe is equal to a length of the second pipe from the second box body to the joining portion between the second pipe and the first pipe.

15. The plasma processing apparatus according to claim 12, further comprising:

a ceiling plate constituting an upper lid of the vacuum container;

a hollow container formed in a manner of being in contact with the ceiling plate; and a heater configured to heat air supplied into the hollow container from an outside, wherein the air passing through the hollow container is supplied to the first box body.

16. The plasma processing apparatus according to claim 15, wherein the ceiling plate is heated by the plasma formed in the processing chamber, and the heating by the heater is performed when generation of the plasma is interrupted.

17. The plasma processing apparatus according to claim 15, wherein the low vapor pressure gas has flammability.

\* \* \* \* \*